(12) United States Patent
Komatsu et al.

(10) Patent No.: US 11,628,651 B2
(45) Date of Patent: Apr. 18, 2023

(54) RESIN COMPOSITION FOR LAMINATED GLASS INTERLAYER FILM OR SOLAR CELL ENCAPSULANT, LAMINATED GLASS INTERLAYER FILM, LAMINATED GLASS, SOLAR CELL ENCAPSULANT, AND SOLAR CELL MODULE

(71) Applicant: DOW-MITSUI POLYCHEMICALS CO., LTD., Tokyo (JP)

(72) Inventors: Harunobu Komatsu, Chiba (JP); Kei Nagayama, Chiba (JP); Norihiko Sato, Chiba (JP); Kana Fukuyama, Chiba (JP); Motoaki Isokawa, Chiba (JP)

(73) Assignee: DOW-MITSUI POLYCHEMICALS CO., LTD., Tokyo (JP)

( * ) Notice: Subject to any disclaimer, the term of this patent is extended or adjusted under 35 U.S.C. 154(b) by 403 days.

(21) Appl. No.: 16/646,735

(22) PCT Filed: Sep. 11, 2018

(86) PCT No.: PCT/JP2018/033610
§ 371 (c)(1),
(2) Date: Mar. 12, 2020

(87) PCT Pub. No.: WO2019/054363
PCT Pub. Date: Mar. 21, 2019

(65) Prior Publication Data
US 2020/0277418 A1     Sep. 3, 2020

(30) Foreign Application Priority Data

Sep. 14, 2017 (JP) .............................. JP2017-176864

(51) Int. Cl.
| | | |
|---|---|---|
| *B32B 17/10* | (2006.01) | |
| *B01J 41/14* | (2006.01) | |
| *B32B 27/30* | (2006.01) | |
| *C08F 210/02* | (2006.01) | |
| *C08J 5/18* | (2006.01) | |
| *C08K 3/08* | (2006.01) | |
| *H01L 31/048* | (2014.01) | |
| *C08K 5/544* | (2006.01) | |

(52) U.S. Cl.
CPC ......... *B32B 17/10743* (2013.01); *B01J 41/14* (2013.01); *B32B 17/10036* (2013.01); *B32B 27/308* (2013.01); *C08F 210/02* (2013.01); *C08J 5/18* (2013.01); *C08K 3/08* (2013.01); *C08K 5/544* (2013.01); *H01L 31/0481* (2013.01); *B32B 2250/03* (2013.01); *B32B 2250/40* (2013.01); *B32B 2307/412* (2013.01); *B32B 2315/08* (2013.01); *B32B 2323/04* (2013.01); *B32B 2333/12* (2013.01); *B32B 2457/12* (2013.01); *C08J 2323/08* (2013.01); *C08J 2423/08* (2013.01); *C08K 2003/0893* (2013.01)

(58) Field of Classification Search
CPC . C08F 210/02; C08K 2003/0893; C08K 3/08; B32B 17/10743; B32B 27/308; B32B 2307/412; B32B 2315/08; B32B 2323/04; B32B 2333/12; B32B 2457/12; B32B 2250/03; B32B 2250/40; B32B 17/10036; C08J 5/18; C08J 2323/08; C08J 2423/08; B01J 41/14; H01L 31/0481
USPC ........................................................ 428/426
See application file for complete search history.

(56) References Cited

U.S. PATENT DOCUMENTS

| | | | |
|---|---|---|---|
| 5,542,677 A | 8/1996 | Sullivan et al. | |
| 7,960,017 B2 | 6/2011 | Pesek et al. | |
| 2002/0055006 A1 | 5/2002 | Vogel et al. | |
| 2005/0267240 A1 | 12/2005 | Chen | |
| 2007/0092706 A1* | 4/2007 | Pesek ................. | C08L 23/0876 428/522 |
| 2009/0130355 A1 | 5/2009 | Chen et al. | |
| 2011/0152007 A1 | 6/2011 | Chen | |
| 2013/0056049 A1* | 3/2013 | Nakata .................... | B32B 27/08 428/447 |

FOREIGN PATENT DOCUMENTS

| | | | | |
|---|---|---|---|---|
| GB | 1125549 A | * | 8/1968 | ............ C08F 210/02 |
| GB | 1125549 A | | 8/1968 | |
| JP | 2009-512763 A | | 3/2009 | |
| JP | 2012-138467 A | | 7/2012 | |
| JP | 2015-195374 A | | 11/2015 | |
| JP | 2015195374 | * | 11/2015 | |
| WO | 2007/047956 A1 | | 4/2007 | |
| WO | 2012/105150 A1 | | 8/2012 | |

OTHER PUBLICATIONS

Extended European Search Report (EESR) dated Apr. 26, 2021 in the corresponding European Patent Application No. 18857151.7.
International Search Report (ISR) issued in PCT/JP2018/033610 dated Dec. 18, 2018.

* cited by examiner

*Primary Examiner* — Hui H Chin
(74) *Attorney, Agent, or Firm* — Rankin, Hill & Clark LLP

(57) ABSTRACT

Provided is a resin composition used for forming a laminated glass interlayer film or a solar cell encapsulant, the resin composition including an ionomer (A) of an ethylene-unsaturated carboxylic acid-based copolymer, wherein metal ions constituting the ionomer (A) of the ethylene-unsaturated carboxylic acid-based copolymer includes two or more kinds of polyvalent metal ions.

16 Claims, 1 Drawing Sheet

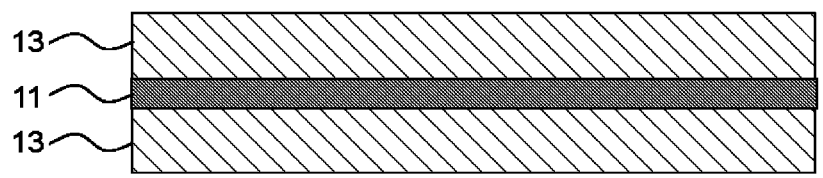

RESIN COMPOSITION FOR LAMINATED GLASS INTERLAYER FILM OR SOLAR CELL ENCAPSULANT, LAMINATED GLASS INTERLAYER FILM, LAMINATED GLASS, SOLAR CELL ENCAPSULANT, AND SOLAR CELL MODULE

TECHNICAL FIELD

The present invention relates to a resin composition for a laminated glass interlayer film or a solar cell encapsulant, a laminated glass interlayer film, a laminated glass, a solar cell encapsulant, and a solar cell module.

BACKGROUND ART

As a laminated glass interlayer film or a solar cell encapsulant, a film formed from an ionomer of an ethylene-unsaturated carboxylic acid-based copolymer is known.

As a technology related to such a laminated glass interlayer film, for example, the technology described in Patent Document 1 (PCT Japanese Translation Patent Publication No. 2009-512763) may be mentioned.

In Patent Document 1, described is a polymer sheet having a thickness of 0.25 mm or more and having at least one layer containing an ionomer or an ionomer blend, in which a partially neutralized α,β-ethylenically unsaturated carboxylic acid is incorporated, characterized in that the ionomer or the ionomer blend contains one or more monovalent metal ions in an amount in the range of about 1% to about 60% and one or more polyvalent metal ions in an amount in the range of about 40% to about 99% with respect to the total amount of neutralization of the α,β-ethylenically unsaturated carboxylic acid.

RELATED DOCUMENT

Patent Document

[Patent Document 1] PCT Japanese Translation Patent Publication No. 2009-512763

SUMMARY OF THE INVENTION

Technical Problem

The technical level required from a laminated glass interlayer film in connection with various characteristics is every increasing. The inventors of the present invention found the following problems in relation to laminated glass interlayer films.

First, the laminated glass interlayer film described in Patent Document 1, the film being formed from an ionomer of an ethylene-unsaturated carboxylic acid-based copolymer containing both a monovalent metal ion and a polyvalent metal ion, has satisfactory water resistance; however, the optical characteristics and the glass adhesive performance are not sufficiently satisfactory.

Here, according to the investigation of the present inventors, it has been found that when the ratio of the monovalent metal ion constituting the ionomer is increased, the optical characteristics of such a laminated glass interlayer film are enhanced to a certain extent. However, when the ratio of the monovalent metal ion that constitutes the ionomer was increased, the water resistance of laminated glass interlayer film was deteriorated this time, and improvement of glass adhesiveness was also difficult.

That is, the inventors of the present invention clarified that there is a trade-off relationship between the optical characteristics and water resistance of a laminated glass interlayer film formed from an ionomer, and this trade-off relationship cannot be sufficiently improved by merely adjusting the ratio between the monovalent metal ion and the polyvalent metal ion in the ionomer, and also clarified that it is very difficult to ameliorate the glass adhesiveness while achieving a balance between the optical characteristics and the water resistance. That is, the present inventors found that there is room for improvement in conventional laminated glass interlayer films formed from ionomers, from the viewpoint of enhancing the optical characteristics and water resistance in a well-balanced manner and obtaining satisfactory glass adhesiveness.

Furthermore, a solar cell encapsulant also has problems similar to the case of the laminated glass interlayer film.

The present invention was achieved in view of the above-described circumstances, and it is an object of the invention to provide a resin composition for a laminated glass interlayer film or a solar cell encapsulant, the interlayer film and the encapsulant having an excellent performance balance between optical characteristics and water resistance and also having excellent adhesiveness to glass or the like.

Solution to Problem

The inventors of the present invention conducted a thorough investigation in order to achieve the object described above. As a result, the present inventors found that by using an ionomer containing two or more kinds of polyvalent metal ions, the trade-off relationship described above can be improved, and optical characteristics and water resistance can be enhanced in a well-balanced manner, while satisfactory adhesiveness to glass or the like can be obtained. Thus, the present invention was completed.

That is, according to the present invention, a resin composition for a laminated glass interlayer film or a solar cell encapsulant, a laminated glass interlayer film, a laminated glass, a solar cell encapsulant, and a solar cell module as disclosed below are provided.

[1]
A resin composition used for forming a laminated glass interlayer film or a solar cell encapsulant,
the resin composition including an ionomer (A) of an ethylene-unsaturated carboxylic acid-based copolymer,
in which metal ions constituting the ionomer (A) of the ethylene-unsaturated carboxylic acid-based copolymer includes two or more kinds of polyvalent metal ions.

[2]
The resin composition as described in the above item [1],
in which the polyvalent metal ions constituting the ionomer (A) of the ethylene-unsaturated carboxylic acid-based copolymer include a first polyvalent metal ion and a second polyvalent metal ion that is different from the first polyvalent metal ion, and
a molar ratio of the second polyvalent metal ion to the first polyvalent metal ion in the ionomer (A) of the ethylene-unsaturated carboxylic acid-based copolymer is equal to or more than 0.10 and equal to or less than 10.0.

[3]
The resin composition as described in the above item [1] or [2],
in which the polyvalent metal ions include two or more selected from calcium ion, magnesium ion, zinc ion, aluminum ion, titanium ion, barium ion, beryllium ion, strontium ion, copper ion, cadmium ion, mercury ion, tin ion, lead ion, iron ion, cobalt ion, and nickel ion.

[4]

The resin composition as described in any one of the above items [1] to [3], in which the metal ions constituting the ionomer (A) of the ethylene-unsaturated carboxylic acid-based copolymer is substantially free of a monovalent metal ion.

[5]

The resin composition as described in any one of the above items [1] to [4], further including a silane coupling agent (B).

[6]

The resin composition as described in the above item [5], in which the silane coupling agent (B) includes a silane coupling agent having an amino group.

[7]

The resin composition as described in the above item [5] or [6], in which a content of the silane coupling agent (B) is equal to or more than 0.001% by mass and equal to or less than 5% by mass when the total amount of the resin composition is designated as 100% by mass.

[8]

The resin composition as described in any one of the above items [1] to [7], in which the ionomer (A) of ethylene-unsaturated carboxylic acid-based copolymer has a degree of neutralization of equal to or higher than 5% and equal to or lower than 95%.

[9]

The resin composition as described in any one of the above items [1] to [8], in which a haze as measured by the following method is less than 1.0%:

(Method)

A film having a size of 120 mm×75 mm×0.4 mm and formed from the above-described composition is obtained. Next, the film thus obtained is interposed between glass plates each having a size of 120 mm×75 mm×3.2 mm, the assembly is retained in a vacuum for 5 minutes at 140° C. in a vacuum laminator and is subjected to pressing for 3 minutes at 0.1 MPa (gauge pressure), and thus a laminated glass is obtained. Next, the haze of the laminated glass thus obtained is measured according to JIS K7136 using a haze meter.

[10]

The resin composition as described in any one of the above items [1] to [9], in which a length of a clouded portion as measured by the following method is 5 mm or less:

(Method)

A film having a size of 120 mm×75 mm×0.4 mm and formed from the above-described composition is obtained. Next, the film thus obtained is interposed between glass plates each having a size of 120 mm×75 mm×3.2 mm, the assembly is retained in a vacuum for 5 minutes at 140° C. in a vacuum laminator and is subjected to pressing for 3 minutes at 0.1 MPa (gauge pressure), and thus a laminated glass is obtained. Next, the laminated glass thus obtained is immersed in warm water at 90° C. for 2 hours. Next, in a clouded portion produced at an edge of the laminated glass, the length of the clouded portion in a direction perpendicular to an end-face of the laminated glass is measured.

[11]

The resin composition as described in any one of the above items [1] to [10], in which an adhesive strength to glass plates as measured by the following method is 10 N/15 mm or greater:

(Method)

A film having a size of 120 mm×75 mm×0.4 mm and formed from the above-described composition is obtained. Next, the film thus obtained is laminated on an air-side of a glass plate having a size of 120 mm×75 mm×3.9 mm, the assembly is retained in a vacuum for 3 minutes at 140° C. in a vacuum laminator and is subjected to pressing for 30 minutes at 0.1 MPa (gauge pressure), and thus the film is adhered to the air-side of the glass plate. Next, the film is separated from the glass plate at a tensile rate of 100 mm/min, and the maximum stress is calculated as the adhesive strength (N/15 mm) to the glass plate.

[12]

The resin composition as described in any one of the above items [1] to [11], in which the ionomer (A) of the ethylene-unsaturated carboxylic acid-based copolymer includes a polyvalent metal ion ionomer (A1) of an ethylene-unsaturated carboxylic acid-based copolymer; and a polyvalent metal ion ionomer (A2) of an ethylene-unsaturated carboxylic acid-based copolymer different from the polyvalent metal ion ionomer (A1) of the ethylene-unsaturated carboxylic acid-based copolymer.

[13]

The resin composition as described in any one of the above items [1] to [12], in which an unsaturated carboxylic acid constituting the ionomer (A) of the ethylene-unsaturated carboxylic acid-based copolymer includes at least one selected from acrylic acid and methacrylic acid.

[14]

The resin composition as described in any one of the above items [1] to [13], in which with regard to the ionomer (A) of the ethylene-unsaturated carboxylic acid-based copolymer, when the total amount of constituent units constituting the ethylene-unsaturated carboxylic acid-based copolymer is designated as 100% by mass, the amount of a constituent unit derived from an unsaturated carboxylic acid is equal to or more than 5% by mass and equal to or less than 35% by mass.

[15]

A laminated glass interlayer film including a layer formed from the resin composition as described in any one of the above items [1] to [14].

[16]

The laminated glass interlayer film as described in the above item [15], having a multilayer configuration including at least one layer formed from the above-described resin composition.

[17]

The laminated glass interlayer film as described in the above [16], having a three-layer configuration including an intermediate layer; and two outer layers formed on both surfaces of the intermediate layer so as to have the intermediate layer interposed therebetween.

[18]

A laminated glass including:

the laminated glass interlayer film as described in any one of the above items [15] to [17]; and a transparent plate-like member provided on both surfaces of the laminated glass interlayer film.

[19]

The laminated glass as described in the above item [18], in which a haze as measured according to JIS K7136 using a haze meter is less than 1.0%.

[20]

The laminated glass as described in the above item [18] or [19], in which a length of a clouded portion as measured by the following method is 5 mm or less:

(Method)

The laminated glass is immersed in warm water at 90° C. for 2 hours. Next, in a clouded portion produced at an edge of the laminated glass, the length of the clouded portion in a direction perpendicular to an end-face of the laminated glass is measured.

[21]

A solar cell encapsulant including a layer formed from the resin composition as described in any one of the above items [1] to [14].

[22]

The solar cell encapsulant as described in the above item [21], having a multilayer configuration including at least one layer formed from the above-described resin composition.

[23]

The solar cell encapsulant as described in the above item [22], having a three-layer configuration including an intermediate layer and two outer layers formed on both surfaces so as to have the intermediate layer interposed therebetween.

[24]

A solar cell module including the solar cell encapsulant as described in any one of the above items [21] to [23] in a configuration thereof.

Advantageous Effects of Invention

According to the present invention, a laminated glass interlayer film and a solar cell encapsulant, both having an excellent performance balance between adhesiveness, optical characteristics, and water resistance, can be realized.

BRIEF DESCRIPTION OF THE DRAWINGS

The object described above, and other objects, features, and advantages will be further clarified by suitable embodiments that will be described below and the following drawings attached thereto.

FIG. 1 is a cross-sectional view schematically illustrating an example of the structure of a laminated glass according to an embodiment of the present invention.

DESCRIPTION OF EMBODIMENTS

Hereinafter, the embodiments of the present invention will be explained using a drawing. The diagram is an outline diagram and is not consistent with the actual dimensional ratios. Meanwhile, unless particularly stated otherwise, the expression "X to Y" of a numerical value range represents a range of equal to or more than X and equal to or less than Y. Furthermore, the term (meth)acryl means acryl or methacryl.

1. Resin Composition

FIG. 1 is a cross-sectional view schematically illustrating an example of the structure of a laminated glass 10 according to the embodiments of the present invention.

A resin composition (P) according to the present embodiment is a resin composition used for forming a laminated glass interlayer film 11 or a solar cell encapsulant and includes an ionomer (A) of an ethylene-unsaturated carboxylic acid-based copolymer, and metal ions constituting the ionomer (A) of the ethylene-unsaturated carboxylic acid-based copolymer includes two or more kinds of polyvalent metal ions.

According to an investigation of the present inventors, a laminated glass interlayer film formed from an ionomer of an ethylene-unsaturated carboxylic acid-based copolymer including both a monovalent metal ion and a polyvalent metal ion has satisfactory water resistance; however, it has been found that the optical characteristics and glass adhesiveness are not sufficiently satisfactory.

Furthermore, according to the investigation of the present inventors, it has been found that when the ratio of the monovalent metal ion constituting the ionomer is increased, the optical characteristics of such a laminated glass interlayer film are enhanced to a certain extent; however, this time, the water resistance of the laminated glass interlayer film is deteriorated, while the glass adhesiveness is also insufficient.

That is, the present inventors clarified that there exists a trade-off relationship between the optical characteristics and water resistance of a laminated glass interlayer film formed from an ionomer, and this trade-off relationship cannot be sufficiently improved by merely adjusting the ratio between the monovalent metal ion and the polyvalent metal ion in the ionomer, and further clarified that it is very difficult to obtain satisfactory glass adhesiveness while achieving a balance between optical characteristics and water resistance. That is, the present inventors found that there is room for improvement in conventional laminated glass interlayer films formed from ionomers, from the viewpoint of enhancing the optical characteristics and water resistance in a well-balanced manner and obtaining satisfactory glass adhesiveness.

Furthermore, a solar cell encapsulant also has problems similar to those of the laminated glass interlayer film.

The present inventors repeatedly conducted a thorough investigation in order to achieve the objects described above. As a result, the inventors found that when an ionomer (A) of an ethylene-unsaturated carboxylic acid-based copolymer containing two or more kinds of polyvalent metal ions is used, the above-described trade-off relationship can be improved, optical characteristics and water resistance can be enhanced in a well-balanced manner, and the adhesiveness to glass can be improved.

That is, in a case in which a resin composition (P) according to the present embodiment includes an ionomer (A) of an ethylene-unsaturated carboxylic acid-based copolymer containing two or more kinds of polyvalent metal ions, a satisfactory performance balance between optical characteristics and water resistance is obtained, and sufficient adhesiveness can be realized.

The reason for this is not clearly known; however, it is speculated to be because when two or more kinds of polyvalent metal ions are included, the crystals of the ethylene chain in the ionomer (A) of the ethylene-unsaturated carboxylic acid-based copolymer are inhibited from growing large, and the optical characteristics and the adhesive performance are further enhanced while the satisfactory water resistance of the ionomer (A) of the ethylene-unsaturated carboxylic acid-based copolymer containing two or more kinds of polyvalent metal ions is maintained.

Furthermore, when the resin composition (P) according to the present embodiment is used, as a silane coupling agent (B) is combined with the ionomer (A) of an ethylene-unsaturated carboxylic acid-based copolymer containing two or more kinds of polyvalent metal ions, a performance balance between adhesiveness, optical characteristics, and water resistance can be further enhanced while processability (film-forming properties) of the resin composition (P) is maintained satisfactorily.

Thereby, a laminated glass interlayer film, a laminated glass, a solar cell encapsulant, and a solar cell module, all of which have excellent external appearance and a superior performance balance between adhesiveness, optical characteristics, and water resistance, can be obtained.

Hereinafter, various components constituting the resin composition (P) according to the present embodiment will be explained.

<Ionomer (A) of Ethylene-Unsaturated Carboxylic Acid-Based Copolymer>

The ionomer (A) of an ethylene-unsaturated carboxylic acid-based copolymer according to the present embodiment is a resin in which at least a portion of carboxyl groups of a polymer obtained by copolymerizing ethylene and at least one kind of unsaturated carboxylic acid have been neutralized with metal ions. Examples of the ethylene-unsaturated carboxylic acid-based copolymer include copolymers containing ethylene and unsaturated carboxylic acids.

Examples of the unsaturated carboxylic acid that constitutes the ionomer (A) of the ethylene-unsaturated carboxylic acid-based copolymer according to the present embodiment include acrylic acid, methacrylic acid, 2-ethylacrylic acid, crotonic acid, maleic acid, fumaric acid, itaconic acid, maleic anhydride, fumaric anhydride, itaconic anhydride, monomethyl maleate, and monoethyl maleate.

Among these, from the viewpoints of productivity, hygiene, and the like of the ethylene-unsaturated carboxylic acid-based copolymer, it is preferable that the unsaturated carboxylic acid includes at least one selected from acrylic acid and methacrylic acid. These unsaturated carboxylic acids may be used singly, or two or more kinds thereof may be used in combination. Furthermore, an ethylene-unsaturated carboxylic acid-based copolymer containing the above-described unsaturated carboxylic acid such as acrylic acid or methacrylic acids a constituent unit is further added to one kind alone or two or more kinds of ionomers of ethylene-unsaturated carboxylic acid-based copolymers, and thus the resultant can be used as the ionomer (A) of the ethylene-unsaturated carboxylic acid-based copolymer.

When an ethylene-unsaturated carboxylic acid-based copolymer is further added to an ionomer of an ethylene-unsaturated carboxylic acid-based copolymer containing two or more kinds of polyvalent metal ions, and thereby an ionomer (A) is obtained, superior adhesiveness can be exhibited while the processability (film-forming properties) of the resin composition (P) is maintained satisfactorily, and the performance balance between optical characteristics and water resistance can be further enhanced.

In the present embodiment, a particularly preferred ethylene-unsaturated carboxylic acid-based copolymer is an ethylene-(meth)acrylic acid copolymer.

With regard to the ionomer (A) of the ethylene-unsaturated carboxylic acid-based copolymer according to the present embodiment, when the total amount of the constituent units constituting the ethylene-unsaturated carboxylic acid-based copolymer is designated as 100% by mass, the amount of a constituent unit derived from ethylene is preferably equal to or more than 65% by mass and equal to or less than 95% by mass, and more preferably equal to or more than 75% by mass and equal to or less than 92% by mass.

When the amount of the constituent unit derived from ethylene is larger than or equal to the lower limit described above, the heat resistance, mechanical strength, water resistance, processability, and the like of a laminated glass interlayer film or a solar cell encapsulant thus obtainable can be further improved. Furthermore, when the amount of the constituent unit derived from ethylene is smaller or equal to the upper limit described above, the transparency, flexibility, adhesiveness, and the like of a laminated glass interlayer film or a solar cell encapsulant thus obtainable can be further improved.

With regard to the ionomer (A) of the ethylene-unsaturated carboxylic acid-based copolymer according to the present embodiment, when the total amount of the constituent units constituting the ethylene-unsaturated carboxylic acid-based copolymer is designated as 100% by mass, the amount of a constituent unit derived from an unsaturated carboxylic acid is preferably equal to or more than 5% by mass and equal to or less than 35% by mass, and more preferably equal to or more than 8% by mass and equal to or less than 25% by mass.

When the amount of the constituent unit derived from an unsaturated carboxylic acid is larger than or equal to the lower limit described above, the transparency, flexibility, adhesiveness, and the like of a laminated glass interlayer film or a solar cell encapsulant thus obtainable can be further improved. Furthermore, when the amount of the constituent unit derived from an unsaturated carboxylic acid is smaller than or equal to the upper limit described above, the heat resistance, mechanical strength, water resistance, processability, and the like of a laminated glass interlayer film or a solar cell encapsulant thus obtainable can be further improved.

In the ionomer (A) of the ethylene-unsaturated carboxylic acid-based copolymer according to the present embodiment, when the total amount of the constituent units constituting the ethylene-unsaturated carboxylic acid-based copolymer is designated as 100% by mass, a constituent unit derived from another copolymerizable monomer may be included in an amount of preferably equal to or more than 0% by mass and equal to or less than 30% by mass, and more preferably equal to or more than 0% by mass and equal to or less than 25% by mass. Examples of the other copolymerizable monomer include unsaturated esters, for example, vinyl esters such as vinyl acetate and vinyl propionate; and (meth)acrylic acid esters such as methyl (meth)acrylate, ethyl (meth)acrylate, isobutyl (meth)acrylate, n-butyl (meth)acrylate, and 2-ethylhexyl (meth)acrylate. When a constituent unit derived from another copolymerizable monomer is included in an amount in the range described above, it is preferable from the viewpoint that the flexibility of a laminated glass interlayer film or a solar cell encapsulant thus obtainable is enhanced.

As the polyvalent metal ion constituting the ionomer (A) of the ethylene-unsaturated carboxylic acid-based copolymer according to the present embodiment, it is preferable that one kind or two or more kinds selected from calcium ion, magnesium ion, zinc ion, aluminum ion, titanium ion, barium ion, beryllium ion, strontium ion, copper ion, cadmium ion, mercury ion, tin ion, lead ion, iron ion, cobalt ion, nickel ion, and the like are included; it is more preferable that two or more kinds selected from calcium ion, magnesium ion, zinc ion, aluminum ion, and barium ion are included; and it is even more preferable that zinc ion and magnesium ion are included.

Furthermore, from the viewpoint of water resistance, it is preferable that the ionomer (A) of the ethylene-unsaturated carboxylic acid-based copolymer according to the present embodiment substantially does not contain a monovalent metal ion. Here, the phrase "substantially does not contain" means that the amount of the monovalent metal ion with respect to the total number of moles of polyvalent metal ions constituting the ionomer (A) of the ethylene-unsaturated carboxylic acid-based copolymer is less than 0.1 mol %.

With regard to the resin composition (P) according to the present embodiment, in a case in which the polyvalent metal ion constituting the ionomer (A) of the ethylene-unsaturated carboxylic acid-based copolymer includes a first polyvalent metal ion and a second polyvalent metal ion different from the first polyvalent metal ion, the molar ratio of the second polyvalent metal ion to the first polyvalent metal ion (number of moles of second polyvalent metal ion/number of moles of first polyvalent metal ion) in the ionomer (A) of the ethylene-unsaturated carboxylic acid-based copolymer is preferably 0.10 or greater, more preferably 0.20 or greater, even more preferably 0.25 or greater, still more preferably 0.30 or greater, and particularly preferably 0.40 or greater, from the viewpoint of obtaining a more satisfactory balance between the optical characteristics and adhesiveness of a laminated glass interlayer film or a solar cell encapsulant thus obtainable.

With regard to the resin composition (P) according to the present embodiment, the molar ratio of the second polyvalent metal ion to the first polyvalent metal ion in the ionomer (A) of the ethylene-unsaturated carboxylic acid-based copolymer is preferably 10.0 or less, more preferably 5.0 or less, even more preferably 4.0 or less, still more preferably 3.0 or less, and particularly preferably 2.5 or less, from the viewpoint of obtaining a more satisfactory balance between optical characteristics and adhesiveness of a laminated glass interlayer film or a solar cell encapsulant thus obtainable.

With regard to the resin composition (P) according to the present embodiment, the ionomer (A) of the ethylene-unsaturated carboxylic acid-based copolymer can be configured to include, for example, a polyvalent metal ion ionomer (A1) of an ethylene-unsaturated carboxylic acid-based copolymer and a polyvalent metal ion ionomer (A2) of an ethylene-unsaturated carboxylic acid-based copolymer.

Thereby, when the mixing ratio between the polyvalent metal ion ionomer (A1) of an ethylene-unsaturated carboxylic acid-based copolymer and the polyvalent metal ion ionomer (A2) of an ethylene-unsaturated carboxylic acid-based copolymer is adjusted, the ratio of the first polyvalent metal ion and the second polyvalent metal ion in the ionomer (A) of the ethylene-unsaturated carboxylic acid-based copolymer can be easily adjusted.

The degree of neutralization of the ionomer (A) of the ethylene-unsaturated carboxylic acid-based copolymer according to the present embodiment is not particularly limited; however, from the viewpoint of further improving the flexibility, adhesiveness, mechanical strength, processability, and the like of a laminated glass interlayer film or a solar cell encapsulant thus obtainable, the degree of neutralization is preferably 95% or less, more preferably 90% or less, even more preferably 80% or less, still more preferably 70% or less, and even more preferably 60% or less.

Furthermore, the degree of neutralization of the ionomer (A) of the ethylene-unsaturated carboxylic acid-based copolymer according to the present embodiment is not particularly limited; however, from the viewpoint of further improving the transparency, heat resistance, water resistance, and the like of a laminated glass interlayer film or a solar cell encapsulant thus obtainable, the degree of neutralization is preferably 5% or higher, more preferably 10% or higher, even more preferably 15% or higher, and particularly preferably 20% or higher.

Here, the degree of neutralization of the ionomer (A) of the ethylene-unsaturated carboxylic acid-based copolymer refers to the proportion (%) of carboxyl groups neutralized by metal ions, among all of the carboxyl groups included in the ethylene-unsaturated carboxylic acid-based copolymer.

The method for producing an ethylene-unsaturated carboxylic acid-based copolymer that constitutes the ionomer (A) of the ethylene-unsaturated carboxylic acid-based copolymer according to the present embodiment is not particularly limited, and the copolymer can be produced by any known method. For example, various polymerization components can be obtained by performing radical copolymerization at high temperature and high pressure. Furthermore, the ionomer (A) of the ethylene-unsaturated carboxylic acid-based copolymer according to the present embodiment can be obtained by reacting the ethylene-unsaturated carboxylic acid-based copolymer with a metal compound. Regarding the ionomer (A) of the ethylene-unsaturated carboxylic acid-based copolymer, it is also acceptable to use a commercially available ionomer.

In the present embodiment, the melt mass flow rate (MFR) of the ionomer (A) of the ethylene-unsaturated carboxylic acid-based copolymer as measured according to JIS K7210:1999 under the conditions of 190° C. and a load of 2,160 g, is preferably equal to or higher than 0.01 g/10 minutes and equal to or lower than 50 g/10 minutes, more preferably equal to or higher than 0.1 g/10 minutes and equal to or lower than 30 g/10 minutes, and particularly preferably equal to or higher than 0.1 g/10 minutes and equal to or lower than 10 g/10 minutes. When the MFR is higher than or equal to the lower limit described above, the processability of the ionomer (A) of the ethylene-unsaturated carboxylic acid-based copolymer can be further improved. When the MFR is lower than or equal to the upper limit described above, the heat resistance, mechanical strength, and the like of a laminated glass interlayer film or a solar cell encapsulant thus obtainable can be further improved.

The content of the ionomer (A) of the ethylene-unsaturated carboxylic acid-based copolymer in the resin composition (P) according to the present embodiment is preferably equal to or more than 50% by mass and equal to or less than 99.999% by mass, more preferably equal to or more than 70% by mass and equal to or less than 99.995% by mass, even more preferably equal to or more than 80% by mass and equal to or less than 99.99% by mass, and particularly preferably equal to or more than 90% by mass and equal to or less than 99.95% by mass, when the total amount of the resin composition (P) is designated as 100% by mass. When the content of the ionomer (A) of the ethylene-unsaturated carboxylic acid-based copolymer is within the range described above, a more satisfactory performance balance between the optical characteristics, interlayer adhesiveness, and water resistance of a laminated glass thus obtainable can be obtained.

<Silane Coupling Agent (B)>

It is preferable that the resin composition (P) according to the present embodiment further includes a silane coupling agent (B) from the viewpoint of achieving a more satisfactory performance balance between the optical characteristics, water resistance, and interlayer adhesiveness of a laminated glass or a solar cell module thus obtainable.

The silane coupling agent (B) according to the present embodiment may be, for example, a silane coupling agent having a vinyl group, an amino group, or an epoxy group and hydrolyzable group such as an alkoxy group. More specifically, examples include vinyltrimethoxysilane, γ-methacryloxypropyltrimethoxysilane, γ-methacryloxypropylmethyldimethoxysilane, γ-acryloxypropyltrimethoxysilane, γ-glycidoxypropyltrimethoxysilane, 3-glycidoxypropylmethyldimethoxysilane, 3-glycidoxypropylmethyldiethoxysilane, N-2-(aminoethyl)-3-aminopropyltrimethoxysilane, N-2-(aminoethyl)-3-aminopropylmethyldiethoxysilane, 3-aminopropyltrimethoxysilane, 3-aminopropyltriethoxysilane, N-phenyl-3-aminopropyltrimethoxysilane, and N-phenyl-3-aminopropyltriethoxysilane. These silane coupling agents (B) may be used singly, or two or more kinds thereof may be used in combination.

Among these, from the viewpoints of achieving a more satisfactory performance balance between the optical characteristics, water resistance, and interlayer adhesiveness of a laminated glass or a solar cell module thus obtainable, a silane coupling agent (B) having an amino group is preferred.

The reason why the performance balance between the optical characteristics, water resistance, and interlayer adhesiveness of a laminated glass or a solar cell module thus obtainable can be further improved by using a silane coupling agent (B) having an amino group is not clearly known; however, it is speculated that when an amino group of a silane coupling agent (B) having an amino group is coordinated to a polyvalent metal inside the ethylene-unsaturated carboxylic acid-based copolymer, since the silane coupling agent (B) is fixed to the ethylene-unsaturated carboxylic acid-based copolymer, and at the same time, an alkoxy group, which is the other functional group in the silane coupling agent (B), reacts with a functional group at the surface of a substrate such as glass, a laminated glass interlayer film or a solar cell encapsulant having excellent optical characteristics and water resistance and also having excellent adhesiveness to glass or the like can be obtained.

Furthermore, when the resin composition (P) according to the present embodiment is used, by employing a silane coupling agent (B) having an amino group in combination with an ionomer (A) of an ethylene-unsaturated carboxylic acid-based copolymer containing two or more kinds of polyvalent metal ions, the performance balance between adhesiveness, optical characteristics, and water resistance can be further enhanced while the processability (film-forming properties) of the resin composition (P) is maintained satisfactorily.

Thereby, a laminated glass interlayer film, a laminated glass, a solar cell encapsulant, and a solar cell module, all of which have excellent external appearance and can achieve a superior performance balance between adhesiveness, optical characteristics, and water resistance, can be obtained.

Examples of the silane coupling agent (B) having an amino group according to the present embodiment include N-(2-aminoethyl)-3-aminopropyltrimethoxysilane, N-(2-aminoethyl)-3-aminopropylmethyldimethoxysilane, N-(2-aminoethyl)-3-aminopropylmethyldiethoxysilane, N-(2-aminoethyl)-3-aminopropyltriethoxysilane, N-(2-aminomethyl)-3-aminopropyltrimethoxysilane, N-(2-aminomethyl)-3-aminopropylmethyldimethoxysilane, N-(2-aminomethyl)-3-aminopropylmethyldiethoxysilane, N-(2-aminomethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-phenyl-3-aminopropyltriethoxysilane, hydrochloride of N-(vinylbenzyl)-2-aminoethyl-3-aminopropyltrimethoxysilane, N-(2-aminomethyl)-8-aminooctyltrimethoxysilane, N-(2-aminoethyl)-8-aminooctyltrimethoxysilane, N-(2-aminomethyl)-8-aminooctyltriethoxysilane, and N-(2-aminoethyl)-8-aminooctyltriethoxysilane.

With regard to the resin composition (P) according to the present embodiment, from the viewpoint of achieving a more satisfactory performance balance between the optical characteristics, water resistance, and interlayer adhesiveness of a laminated glass or a solar cell module thus obtainable, the content of the silane coupling agent (B) is preferably equal to or more than 0.001% by mass and equal to or less than 5% by mass, more preferably equal to or more than 0.005% by mass and equal to or less than 2% by mass, and even more preferably equal to or more than 0.01% by mass and equal to or less than 1% by mass, when the total amount of the resin composition (P) is designated as 100% by mass.

With regard to the resin composition (P) according to the present embodiment, from the viewpoint of achieving a more satisfactory performance balance between the optical characteristics, water resistance, and interlayer adhesiveness of a laminated glass or a solar cell module thus obtainable, the content of the silane coupling agent (B) having an amino group is preferably equal to or more than 30% by mass and equal to or less than 100% by mass, more preferably equal to or more than 50% by mass and equal to or less than 100% by mass, and even more preferably equal to or more than 70% by mass and equal to or less than 100% by mass, when the content of the silane coupling agent (B) in the resin composition (P) is designated as 100% by mass.

<Other Components>

In the resin composition (P) according to the present embodiment, components other than the ionomer (A) of the ethylene-unsaturated carboxylic acid-based copolymer and the silane coupling agent (B) can be incorporated to the extent that does not impair the purpose of the present invention. The other components are not particularly limited; however, examples include a plasticizer, an oxidation inhibitor, an ultraviolet absorber, a wavelength conversion agent, an antistatic agent, a surfactant, a colorant, a photostabilizer, a foaming agent, a lubricating agent, a crystal nucleating agent, a crystallization accelerator, a crystallization retardant, a catalyst deactivator, a heat ray absorber, a heat ray reflecting agent, a heat dissipating agent, a thermoplastic resin other than the ionomer (A) of the ethylene-unsaturated carboxylic acid-based copolymer, a thermosetting resin, an inorganic filler, an organic filler, an impact resistance improving agent, a slip agent, a crosslinking agent, a crosslinking aid, a tackifier, a processing aid, a mold release agent, a hydrolysis inhibitor, a heat-resistant stabilizer, an antiblocking agent, an antifogging agent, a flame retardant, a flame retardant aid, a light diffusing agent, an antibacterial agent, an antifungal agent, a dispersant, and other resins. The other components may be used singly, or two or more kinds thereof may be used in combination.

<Haze>

With regard to the resin composition (P) according to the present embodiment, the haze as measured by the following method is preferably less than 1.0%, more preferably less than 0.8%, and even more preferably less than 0.6%. When the haze is less than the upper limit described above, more satisfactory transparency of a laminated glass or a solar cell module thus obtainable can be obtained.

In order to achieve such a haze, the molar ratio of the second polyvalent metal ion to the first polyvalent metal ion in the ionomer (A) of the ethylene-unsaturated carboxylic acid-based copolymer, the content of the ionomer (A) of the ethylene-unsaturated carboxylic acid-based copolymer in the resin composition (P) according to the present embodiment, or the like may be adjusted as appropriate.

The lower limit of the haze of the resin composition (P) according to the present embodiment is not particularly limited; however, for example, the lower limit is 0.01% or higher.

When the resin composition (P) according to the present embodiment is used, the haze of the laminated glass according to the present embodiment can be adjusted to a value of less than 1.0%. A preferred haze of the laminated glass is the same as described above.

(Method)

A film having a size of 120 mm×75 mm×0.4 mm formed from the resin composition (P) according to the present embodiment is obtained. Next, the film thus obtained is interposed between glass plates each having a size of 120 mm×75 mm×3.2 mm, the assembly is maintained in a vacuum at 140° C. for 5 minutes in a vacuum laminator and is subjected to pressing for 3 minutes at 0.1 MPa (gauge pressure), and thus a laminated glass is obtained. Next, the haze of the laminated glass thus obtained is measured according to JIS K7136 using a haze meter.

<Length of Clouded Portion>

With regard to the resin composition (P) according to the present embodiment, the length of the clouded portion as measured by the following method is preferably 5 mm or less, more preferably 2 mm or less, and particularly preferably 1 mm or less. When the length of the clouded portion is less than or equal to the upper limit described above, more satisfactory water resistance of a laminated glass or a solar cell module thus obtainable can be obtained.

In order to achieve such a length of the clouded portion, the molar ratio of the second polyvalent metal ion to the first polyvalent metal ion in the ionomer (A) of the ethylene-unsaturated carboxylic acid-based copolymer, the content of the ionomer (A) of the ethylene-unsaturated carboxylic acid-based copolymer in the resin composition (P) according to the present embodiment, and the like may be adjusted as appropriate; however, the molar ratio of the second polyvalent metal ion to the first polyvalent metal ion in the ionomer (A) of the ethylene-unsaturated carboxylic acid-based copolymer becomes especially important.

The lower limit of the length of the clouded portion of the resin composition (P) according to the present embodiment is preferably 0 mm.

When the resin composition (P) according to the present embodiment is used, the length of the clouded portion of the laminated glass according to the present embodiment can be adjusted to be 5 mm or less. A preferred value of the clouded portion of the laminated glass is the same as described above.

(Method)

A film having a size of 120 mm×75 mm×0.4 mm formed from the resin composition (P) according to the present embodiment is obtained. Next, the film thus obtained is interposed between glass plates each having a size of 120 mm×75 mm×3.2 mm, the assembly is maintained in a vacuum at 140° C. for 5 minutes in a vacuum laminator and is subjected to pressing for 3 minutes at 0.1 MPa (gauge pressure), and thus a laminated glass is obtained. Next, the laminated glass thus obtained is immersed in warm water at 90° C. for 2 hours. Next, in a clouded portion produced at the edges of the laminated glass, the length of the clouded portion in a direction perpendicular to an end-face of the laminated glass is measured.

<Adhesive Strength to Glass Plate>

With regard to the resin composition (P) according to the present embodiment, the adhesive strength to a glass plate as measured by the following method is preferably 10 N/15 mm or greater, more preferably 15 N/15 mm or greater, and particularly preferably 20 N/15 mm or greater. When the adhesive strength to a glass plate is greater than or equal to the lower limit, more satisfactory interlayer adhesiveness of a laminated glass or a solar cell module thus obtainable can be obtained.

In order to achieve such adhesive strength to a glass plate, the contents, type, and the like of the ionomer (A) of the ethylene-unsaturated carboxylic acid-based copolymer and the silane coupling agent (B) in the resin composition (P) according to the present embodiment may be adjusted as appropriate.

(Method)

A film having a size of 120 mm×75 mm×0.4 mm formed from the resin composition (P) according to the present embodiment is obtained. Next, the film thus obtained is laminated on an air-side of a glass plate having a size of 120 mm×75 mm×3.9 mm, the assembly is maintained in a vacuum at 140° C. for 3 minutes in a vacuum laminator and is subjected to pressing for 30 minutes at 0.1 MPa (gauge pressure), and the film is adhered to the air-side of the glass plate. Next, the film is separated from the glass plate at a tensile rate of 100 mm/min, and the maximum stress is calculated as the adhesive strength (N/15 mm) to the glass plate.

2. Laminated Glass Interlayer Film and Solar Cell Encapsulant

The laminated glass interlayer film 11 according to the present embodiment includes a layer formed from the resin composition (P) according to the present embodiment.

The laminated glass interlayer film 11 according to the present embodiment may have a single layer configuration or may have a multilayer configuration having two or more layers.

More specifically, the laminated glass interlayer film 11 according to the present embodiment may be a film having a single layer configuration composed of one layer formed from the resin composition (P) according to the present embodiment; may be a film having a multilayer configuration composed of two or more layers formed from the resin composition (P) according to the present embodiment; or may be a film having a multilayer configuration having at least one layer formed from the resin composition (P) according to the present embodiment and at least one layer other than the layer formed from the resin composition (P) according to the present embodiment.

In a case in which the laminated glass interlayer film 11 according to the present embodiment has a multilayer configuration, it is preferable that the multilayer configuration is a two-layer configuration obtained by laminating two outer layers (hereinafter, also referred to as adhesive layers), in which at least one layer of the outer layers is formed from the resin composition (P) according to the present embodiment; or a three-layer configuration including an intermediate layer and two outer layers formed on both surfaces of the intermediate layer so as to have the intermediate layer interposed therebetween, in which at least one layer of the outer layers and the intermediate layer is formed from the resin composition (P) according to the present embodiment. From the viewpoint of achieving both transparency and adhesiveness, the three-layer configuration is more preferred, and a three-layer configuration in which the outer layers and the intermediate layer are formed from the resin composition (P) according to the present embodiment is particularly preferred.

For a film having a multilayer configuration having a plurality of layers formed from the resin composition (P) according to the present embodiment, the composition of the resin composition (P) according to the present embodiment or the type of the ionomer incorporated in the respective layers (for example, the copolymerization ratio and the degree of neutralization of the ethylene-unsaturated carboxylic acid-based copolymer, and the type of the metal ions) may be identical or different.

The thickness of the laminated glass interlayer film 11 according to the present embodiment is, for example, equal to or more than 0.1 mm and equal to or less than 10 mm, preferably equal to or more than 0.2 mm and equal to or less than 5 mm, and more preferably equal to or more than 0.3 mm and equal to or less than 2 mm.

When the thickness of the laminated glass interlayer film 11 is larger than or equal to the lower limit, more satisfactory mechanical strength of the laminated glass interlayer film 11 can be obtained. Furthermore, when the thickness of the laminated glass interlayer film 11 is less than or equal to the upper limit, more satisfactory optical characteristics and interlayer adhesiveness of a laminated glass thus obtainable can be obtained.

In a case in which the laminated glass interlayer film 11 according to the present embodiment has a multilayer configuration, a layer formed from the resin composition (P) according to the present embodiment may be used in an outer layer or may be used in an intermediate layer.

From the viewpoint of the adhesiveness to a transparent plate-like member, in the case of using the resin composition (P) according to the present embodiment in an outer layer, it is preferable that the resin composition (P) includes a silane coupling agent (B).

Furthermore, in the case of using the resin composition (P) according to the present embodiment in an intermediate layer, the resin composition (P) may include a silane coupling agent (B); however, for example, in a case in which the resin composition (P) according to the present embodiment is used in an outer layer and an intermediate layer, and the layer configuration is set to "outer layer/intermediate layer/outer layer" or the like, since there are occasions in which the intermediate layer is not required to have adhesiveness to a material other than the outer layers, it is preferable that the resin composition (P) used in the intermediate layer substantially does not include a silane coupling agent (B). Specifically, from the viewpoint of production stability, the percentage content of the silane coupling agent in the intermediate layer is preferably 0.1% by mass or less of the solid content of the intermediate layer. Furthermore, a case in which a silane coupling agent is not included in the intermediate layer (0% by mass) is particularly preferred.

In a case in which the laminated glass interlayer film 11 according to the present embodiment includes outer layers and an intermediate layer, the thickness of the outer layer may be arbitrary; however, the thickness a of an outer layer is preferably in the range of 1 μm to 500 μm, more preferably in the range of 10 μm to 500 μm, and particularly preferably in the range of 20 μm to 300 μm.

When the thickness a is 1 μm or more, the adhesive strength can be further enhanced, and when the thickness a is 500 μm or less, transparency is superior.

Furthermore, in a case in which the laminated glass interlayer film 11 according to the present embodiment includes outer layers and an intermediate layer, in view of transparency, the thickness of the intermediate layer in the thickness of all the layers may be thick. Specifically, the thickness b of the intermediate layer can be set freely within the range of subtracting the preferred thickness a of an outer layer from the range of 0.1 mm to 10 mm, which is a preferred total thickness.

In a case in which the laminated glass interlayer film 11 according to the present embodiment includes outer layers and an intermediate layer, the ratio of thicknesses (a/b) between the outer layer (thickness a) and the intermediate layer (thickness b) is preferably 1/20 to 5/1, more preferably 1/15 to 3/1, and even more preferably 1/10 to 3/1. Here, in a case in which the laminated glass interlayer film 11 according to the present embodiment includes two outer layers, the thickness a of the outer layer is an average value of the thickness of the two outer layers.

When the ratio of thickness (a/b) of the outer layer and the intermediate layer is within the range described above, adhesiveness and transparency are further enhanced.

The method for producing the laminated glass interlayer film 11 according to the present embodiment is not particularly limited, and any conventionally known production method can be used.

Regarding the method for producing the laminated glass interlayer film 11 according to the present embodiment, for example, a press molding method, an extrusion molding method, a T-die molding method, an injection molding method, a compression molding method, a cast molding method, a calender molding method, or an inflation molding method can be used.

A solar cell encapsulant according to the present embodiment is formed from the resin composition (P) according to the present embodiment.

Also for the solar cell encapsulant according to the present embodiment, a configuration and a film thickness similar to those of a reinforced glass interlayer film are preferred, and the solar cell encapsulant can also be produced by a similar production method.

3. Laminated Glass

FIG. 1 is a cross-sectional view schematically illustrating an example of the structure of a laminated glass 10 according to an embodiment of the present invention.

The laminated glass 10 according to the present embodiment includes the laminated glass interlayer film 11 according to the present embodiment; and transparent plate-like members 13 provided on both surfaces of the laminated glass interlayer film 11. The laminated glass 10 according to the present embodiment includes the laminated glass interlayer film 11 according to the present embodiment and therefore has an excellent performance balance between optical characteristics and water resistance. Furthermore, the interlayer adhesiveness between the laminated glass interlayer film 11 and the transparent plate-like member 13 is also excellent.

Two or more layers of the laminated glass interlayer film 11 may be used, or the laminated glass interlayer film 11 may be composed of three or more layers by interposing a layer formed from another resin between two sheets of the laminated glass interlayer film 11.

The transparent plate-like member 13 is not particularly limited; however, for example, a generally used transparent plate glass can be used, and examples include inorganic glass such as float plate glass, polished plate glass, figured glass, network wired plate glass, wired plate glass, colored plate glass, heat-ray absorbing plate glass, heat-ray reflective plate glass, and green glass. Furthermore, organic plastic plates such as a polycarbonate plate, a poly(meth)acrylate plate, a polymethyl (meth)acrylate plate, a polystyrene plate, a cyclic polyolefin plate, a polyethylene terephthalate plate, a polyethylene naphthalate plate, and a polyethylene butyrate plate can also be used.

The transparent plate-like member 13 may be appropriately subjected to a surface treatment such as a corona treatment, a plasma treatment, or a flame treatment.

The thickness of the transparent plate-like member 13 is, for example, equal to or more than 1 mm and equal to or less than 20 mm. In the laminated glass 10 according to the present embodiment, regarding the respective transparent plate-like members 13 provided on both surfaces of the laminated glass interlayer film 11, the same members may be used, or different plate-like members may be used in combination.

The method for producing the laminated glass 10 according to the present embodiment is not particularly limited, and for example, conventionally known production methods such as a nip roll method, an autoclave method, a vacuum bag method, and a vacuum laminator method can be used. Production may be carried out using one kind of these techniques, or production can also be carried out using two or more kinds of production methods in combination.

As the method for producing the laminated glass 10 according to the present embodiment, for example, as shown in FIG. 1, a method of interposing the laminated glass interlayer film 11 according to the present embodiment between two sheets of the transparent plate-like member 13 and then heating and pressurizing the assembly, or the like is used.

These laminated glasses can be used in various use applications, and for example, the laminated glasses are used for laminated glasses for construction, laminated glasses for automobiles, general constructions, agricultural constructions, and windows for railways; however, the use is not limited to these use applications.

4. Solar Cell Module

A solar cell module according to the present embodiment includes at least a substrate to which solar light is incident; a solar cell element; and the solar cell encapsulant according to the present embodiment. The solar cell module according to the present embodiment may further include a protective material as necessary. Meanwhile, the substrate to which solar light is incident may be simply referred to as substrate.

The solar cell module according to the present embodiment can be produced by fixing a solar cell element encapsulated by the solar cell encapsulant according to the present embodiment onto the substrate.

Regarding such a solar cell module, various types of solar cells modules may be mentioned as examples. Examples include a solar cell module having a configuration in which a solar cell element is interposed between encapsulants on both sides of the solar cell element, as in the case of substrate/encapsulant/solar cell element/encapsulant/protective material; a solar cell module in which a solar cell element formed in advance on the surface of a substrate such as glass, is configured as in the case of substrate/solar cell element/encapsulant/protective material; and a solar cell module having a configuration in which an encapsulant and a protective material are formed on a solar cell element formed on the inner peripheral surface of the substrate, for example, an amorphous solar cell element produced on a fluororesin-based sheet by sputtering or the like.

Meanwhile, when the substrate to which solar light is incident is designated as the upper part of the solar cell module, since the protective material is provided on the opposite side of the substrate side of the solar cell module, that is, in the lower part, the protective material may also be referred to as lower protective material.

Regarding the solar cell element, various solar cell elements including silicon systems such as monocrystalline silicon, polycrystalline silicon, and amorphous silicon; and Group III-V or Group II-VI compound semiconductor systems such as gallium-arsenic, copper-indium-selenium, copper-indium-gallium-selenium, and cadmium-tellurium, can be used. The solar cell encapsulant according to the present embodiment is particularly useful for the encapsulation of an amorphous silicon solar cell element and a heterojunction type solar cell element of amorphous silicon and monocrystalline silicon.

Examples of the substrate that constitutes the solar cell module according to the present embodiment include glass, an acrylic resin, a polycarbonate, a polyester, and a fluorine-containing resin.

The protective material (lower protective material) is a single substance of metals or various thermoplastic resin films, or a multilayer sheet, and examples include single-layer or multilayer sheets of metals such as tin, aluminum, and stainless steel; inorganic materials such as glass; a polyester, an inorganic vapor deposited polyester, a fluorine-containing resin, a polyolefin, and the like. The solar cell encapsulant according to the present embodiment exhibits satisfactory adhesiveness to these substrates or protective materials.

When a solar cell element, a substrate, and a protective material such as described above are laminated and adhered together using the solar cell encapsulant according to the present embodiment, even without carrying out a crosslinking process by pressurizing and heating over a long time period, which has been traditionally carried out for ethylene-vinyl acetate copolymer systems, adhesive strength that can endure practical use and the long-term stability of the adhesive strength can be imparted. However, from the viewpoint of imparting stronger adhesive strength or adhesive strength stability, it is recommended to apply a pressurizing and heating treatment for a short time period.

Thus, embodiments of the present invention have been described with reference to the drawings; however, these are only examples of the present invention, and various configurations in addition to the above-described configurations can also be employed.

EXAMPLES

Hereinafter, the present invention will be specifically described based on Examples; however, the present invention is not intended to be limited to these Examples.

(1) Evaluation Methods
[Optical Characteristics]

A film formed from each of the resin compositions obtained in Examples and Comparative Examples was cut out into a size of 120 mm×75 mm×0.4 mm. Next, the film thus obtained was interposed between glass plates each having a size of 120 mm×75 mm×3.2 mm (manufactured by Asahi Glass Co., Ltd., product name: float plate glass), the assembly was maintained in a vacuum at 140° C. for 5 minutes in a vacuum laminator and was subjected to pressing for 3 minutes at 0.1 MPa (gauge pressure), and thus a laminated glass was obtained. The laminated glass thus obtained was cooled by slowly cooling so as to return to room temperature over about 30 minutes. Next, the haze of the laminated glass thus obtained was measured according to JIS K7136 using a haze meter (manufactured by Murakami Color Research Laboratory Co., Ltd., product name: HAZE METER HM150). Next, the optical characteristic of the resin compositions obtained in Examples and Comparative Examples were evaluated according to the following criteria.

A (excellent): The haze is lower than 0.8%.

B (good): The haze is higher than or equal to 0.8% and lower than 1.0%.

C (poor): The haze is 1.0% or higher.

[Water Resistance]

A film formed from each of the resin compositions obtained in Examples and Comparative Examples was cut out into a size of 120 mm×75 mm×0.4 mm. Next, the film thus obtained was interposed between glass plates (manufactured by Asahi Glass Co., Ltd., product name: float plate glass) each having a size of 120 mm×75 mm×3.2 mm, the assembly was maintained in a vacuum at 140° C. for 5 minutes in a vacuum laminator and was subjected to pressing for 3 minutes at 0.1 MPa (gauge pressure), and thus a laminated glass was obtained. Next, the laminated glass thus obtained was immersed in warm water at 90° C. for 2 hours. Next, in a clouded portion produced at the edges of the laminated glass, the length of the clouded portion in a direction perpendicular to an end-face of the laminated glass was measured. Next, the water resistance of the resin compositions obtained in Examples and Comparative Examples was evaluated according to the following criteria.

A (excellent): The length of the clouded portion is 1 mm or less.

B (good): The length of the clouded portion is more than 1 mm and 5 mm or less.

C (poor): The length of the clouded portion is more than 5 mm.

[Interlayer Adhesiveness]

A film formed from each of the resin compositions obtained in Examples and Comparative Examples was cut out into a size of 120 mm×75 mm×0.4 mm. Next, the film thus obtained was laminated on an air-side of a glass plate (manufactured by Asahi Glass Co., Ltd., product name: blue plate glass) having a size of 120 mm x 75 mm×3.9 mm, the assembly was maintained in a vacuum at 140° C. for 3 minutes in a vacuum laminator and was subjected to pressing for 30 minutes at 0.1 MPa (gauge pressure), and thus the film was adhered to the air-side of the glass plate. Next, the film was separated from the glass plate at a tensile rate of 100 mm/min, and the maximum stress was calculated as the adhesive strength (N/15 mm) to a glass plate. Next, the interlayer adhesiveness in a laminated glass of the resin compositions obtained in the Examples and Comparative Examples was evaluated.

A (excellent): The adhesive strength to a glass plate is 20 N/15 mm or higher.

B (good): The adhesive strength to a glass plate is 10 N/15 mm or higher and lower than 20 N/15 mm.

C (poor): The adhesive strength to a glass plate is lower than 10 N/15 mm.

(2) Materials

The details of the materials used for the production of laminated glasses are as follows.

<Ionomer of Ethylene-Unsaturated Carboxylic Acid-Based Copolymer>

IO-1: Ionomer of ethylene-methacrylic acid copolymer (ethylene content: 80% by mass, methacrylic acid content: 20% by mass, metal ion: magnesium ion, degree of neutralization: 40%, MFR (measured according to JIS K7210:1999 under the conditions of 190° C. and a load of 2,160 g): 3.6 g/10 min)

IO-2: Ionomer of ethylene-methacrylic acid copolymer (ethylene content: 81% by mass, methacrylic acid content: 19% by mass, metal ion: zinc ion, degree of neutralization: 47%, MFR (measured according to JIS K7210:1999 under the conditions of 190° C. and a load of 2,160 g): 4.0 g/10 min)

IO-3: Ionomer of ethylene-methacrylic acid copolymer (ethylene content: 80% by mass, methacrylic acid content: 20% by mass, metal ion: zinc ion, degree of neutralization: 40%, MFR (measured according to JIS K7210:1999 under the conditions of 190° C. and a load of 2,160 g): 3.0 g/10 min)

IO-4: Ionomer of ethylene-methacrylic acid copolymer (ethylene content: 81% by mass, methacrylic acid content: 19% by mass, metal ion: sodium ion, degree of neutralization: 45%, MFR (measured according to JIS K7210:1999 under the conditions of 190° C. and a load of 2,160 g): 4.5 g/10 min)

<Silane Coupling Agent>

Si-C1: Silane coupling agent having an amino group (N-(2-aminoethyl)-3-aminopropyltrimethoxysilane, KBM-603, manufactured by Shin-Etsu Chemical Co., Ltd.)

Si-C2: Silane coupling agent having an amino group (N-(2-aminoethyl)-3-aminopropylmethyldimethoxysilane, KBM-602, manufactured by Shin-Etsu Chemical Co., Ltd.)

Si-C3: Silane coupling agent having a glycidyl group (3-glycidoxypropyltrimethoxysilane, KBM-403, manufactured by Shin-Etsu Chemical Co., Ltd.)

Examples 1 to 7 and Comparative Examples 1 to 3 and 5 to 12

An ionomer of an ethylene-unsaturated carboxylic acid-based copolymer and a silane coupling agent were melted and kneaded at 160° C. at the mixing ratios indicated in Tables 1 and 2, and resin compositions were respectively obtained.

Next, the resin compositions thus obtained were extrusion molded under the conditions of a resin temperature at the extruder die outlet port of 160° C. and a processing rate of 5 m/min, and thereby laminated glass interlayer films having a thickness of 0.4 mm were respectively obtained.

Example 8 and Comparative Example 4

An ionomer of an ethylene-unsaturated carboxylic acid-based copolymer and a silane coupling agent were melted and kneaded at 160° C. at the mixing ratios indicated in Table 1, and resin compositions to be used for adhesive layers were respectively obtained. Next, an ionomer of an ethylene-unsaturated carboxylic acid-based copolymer only was melted and kneaded at 160° C., and resin compositions to be used for intermediate layers were respectively obtained. Next, the resin compositions to be used for adhesive layers and the resin compositions to be used for intermediate layers thus obtained were used by setting the thickness ratio to be adhesive layer/intermediate layer/adhesive layer=40 µm/320 µm/40 µm at a resin temperature of 160° C. using two kinds of 65-mmφ three-layer T-die molding machine, and thus multilayer sheets (laminated glass interlayer films having a multilayer structure) having a total thickness of 400 µm (0.4 mm) were respectively produced.

The above-described evaluations were respectively carried out for the laminated glass interlayer films thus obtained. The results thus obtained are respectively presented in Tables 1 and 2.

TABLE 1

|  |  |  | Example 1 | Example 2 | Example 3 | Example 4 | Example 5 | Example 6 | Example 7 |
|---|---|---|---|---|---|---|---|---|---|
| Layer configuration of sheet |  |  | Single layer | Single layer | Single layer | Single layer | Single layer | Single layer | Single layer |
| Ionomer of ethylene-unsaturated carboxylic acid-based copolymer | Adhesive layer (in the case of multilayer configuration) | IO-1 [parts by mass] | 60 | 40 | 60 | 40 | 80 | 80 | 20 |
|  |  | IO-2 [parts by mass] | 40 | 60 | — | — | 20 | — | — |
|  |  | IO-3 [parts by mass] | — | — | 40 | 60 | — | 20 | 80 |
|  |  | Zn ion/Mg ion (molar ratio) [—] | 0.75/1 | 1.68/1 | 0.67/1 | 1.50/1 | 0.28/1 | 0.25/1 | 4.0/1 |
| Silane coupling agent |  | Si—C1 [parts by mass] | 0.2 | 0.2 | 0.2 | 0.2 | 0.2 | 0.2 | 0.2 |
| Ionomer of ethylene-unsaturated carboxylic acid-based copolymer | Intermediate layer (in the case of multilayer configuration) | IO-1 [parts by mass] | — | — | — | — | — | — | — |
|  |  | IO-3 [parts by mass] | — | — | — | — | — | — | — |
| Layer ratio (adhesive layer/intermediate layer) |  |  | — | — | — | — | — | — | — |
| Evaluation |  | Optical characteristics | A | A | A | A | A | A | B |
|  |  | Water resistance | A | A | A | A | A | A | A |
|  |  | Interlayer adhesiveness | A | A | A | A | B | B | A |

|  |  |  | Example 8 | Comparative Example 1 | Comparative Example 2 | Comparative Example 3 | Comparative Example 4 |
|---|---|---|---|---|---|---|---|
| Layer configuration of sheet |  |  | Two kinds three layers | Single layer | Single layer | Single layer | Two kinds three layers |
| Ionomer of ethylene-unsaturated carboxylic acid-based copolymer | Adhesive layer (in the case of multilayer configuration) | IO-1 [parts by mass] | 60 | 100 | — | — | — |
|  |  | IO-2 [parts by mass] | 40 | — | 100 | — | 100 |
|  |  | IO-3 [parts by mass] | — | — | — | 100 | — |
|  |  | Zn ion/Mg ion (molar ratio) [—] | 0.75/1 | 0/1 | 1/0 | 1/0 | 1/0 |
| Silane coupling agent |  | Si—C1 [parts by mass] | 0.1 | 0.2 | 0.2 | 0.2 | 0.1 |
| Ionomer of ethylene-unsaturated carboxylic acid-based copolymer | Intermediate layer (in the case of multilayer configuration) | IO-1 [parts by mass] | 60 | — | — | — | 60 |
|  |  | IO-3 [parts by mass] | 40 | — | — | — | 40 |
| Layer ratio (adhesive layer/intermediate layer) |  |  | 1/8 | — | — | — | — |
| Evaluation |  | Optical characteristics | A | A | C | C | C |
|  |  | Water resistance | A | A | A | A | A |
|  |  | Interlayer adhesiveness | A | C | A | A | A |

TABLE 2

|  |  | Comparative Example 5 | Comparative Example 6 | Comparative Example 7 | Comparative Example 8 | Comparative Example 9 | Comparative Example 10 | Comparative Example 11 | Comparative Example 12 |
| --- | --- | --- | --- | --- | --- | --- | --- | --- | --- |
| Layer configuration of sheet |  | Single layer | Single layer | Single layer | Single layer | Single layer | Single layer | Single layer | Single layer |
| Ionomer of ethylene-unsaturated carboxylic acid-based copolymer | IO-4 [parts by mass] | — | 100 | 80 | 60 | 40 | 20 | — | 40 |
|  | IO-2 [parts by mass] | 100 | — | 20 | 40 | 60 | 80 | 100 | 60 |
|  | Zn ion/ Na ion (molar ratio) [—] | 1/0 | 0/1 | 0.13/1 | 0.35/1 | 0.79/1 | 2.1/1 | 1/0 | 0.79/1 |
| Silane coupling agent | Si—C2 [parts by mass] | 0.1 | — | — | — | — | — | — | — |
|  | Si—C3 [parts by mass] | — | — | — | — | — | — | — | 0.1 |
| Evaluation | Optical characteristics | C | A | B | B | C | C | C | — |
|  | Water resistance | A | C | B | A | A | A | A | — |
|  | Interlayer adhesiveness | A | C | C | C | C | C | C | — |

The laminated glass interlayer films of Examples 1 to 8 exhibited an excellent performance balance between optical characteristics, water resistance, interlayer adhesiveness, and external appearance. In contrast, the laminated glass interlayer films of Comparative Examples 1 to 12 exhibited a poor performance balance between optical characteristics, water resistance, interlayer adhesiveness, and external appearance.

Meanwhile, in the laminated glass interlayer film of Comparative Example 12, particles were generated on the surface, and the film had poor external appearance. That is, the resin composition of Comparative Example 11 had poor processability (film-forming properties). Therefore, the resin composition of Comparative Example 12 was not subjected to the various evaluations.

This patent application claims priority based on Japanese Patent Application No. 2017-176864, filed on Sep. 14, 2017, the entire disclosure of which is incorporated herein by reference.

The invention claimed is:

1. A resin composition used for forming a laminated glass interlayer film or a solar cell encapsulant, the resin composition comprising:
    an ionomer (A) of an ethylene-unsaturated carboxylic acid-based copolymer,
    wherein metal ions constituting the ionomer (A) of the ethylene-unsaturated carboxylic acid-based copolymer includes two or more kinds of polyvalent metal ions,
    the polyvalent metal ions include zinc ion and magnesium ion,
    a molar ratio of the zinc ion to the magnesium ion is equal to or more than 0.67 and equal to or less than 1.68,
    the resin composition further comprises a silane coupling agent (B), and
    a haze as measured by the following method is less than 0.8%:
    (method)
    a film having a size of 120 mm×75 mm×0.4 mm and formed from the resin composition is obtained; next, the film thus obtained is interposed between glass plates each having a size of 120 mm×75 mm×3.2 mm, the assembly is maintained in a vacuum at 140° C. for 5 minutes in a vacuum laminator and is subjected to pressing for 3 minutes at 0.1 MPa (gauge pressure), and thus a laminated glass is obtained; and next, the haze of the laminated glass is measured according to JIS K7136 using a haze meter.

2. The resin composition according to claim 1, wherein an amount of monovalent metal ions with respect to the total number of moles of polyvalent metal ions constituting the ionomer (A) of the ethylene-unsaturated carboxylic acid-based copolymer is less than 0.1 mol %.

3. The resin composition according to claim 1, wherein the silane coupling agent (B) includes a silane coupling agent having an amino group.

4. The resin composition according to claim 1, wherein a content of the silane coupling agent (B) is equal to or more than 0.001% by mass and equal to or less than 5% by mass when the total amount of the resin composition is designated as 100% by mass.

5. The resin composition according to claim 1, wherein a length of a clouded portion as measured by the following method is 5 mm or less:
    (method)
    a film having a size of 120 mm×75 mm×0.4 mm and formed from the resin composition is obtained; next, the film thus obtained is interposed between glass plates each having a size of 120 mm×75 mm×3.2 mm, the assembly is maintained in a vacuum at 140° C. for 5 minutes in a vacuum laminator and is subjected to pressing for 3 minutes at 0.1 MPa (gauge pressure), and a laminated glass is obtained; next, the laminated glass thus obtained is immersed in warm water at 90° C. for 2 hours; and next, in a clouded portion produced at an edge of the laminated glass, the length of the clouded portion in a direction perpendicular to an end-face of the laminated glass is measured.

6. The resin composition according to claim 1,
wherein an adhesive strength to a glass plate as measured by the following method is 10 N/15 mm or greater:
(method)
a film having a size of 120 mm×75 mm×0.4 mm and formed from the resin composition is obtained; next, the film thus obtained is laminated on an air-side of a glass plate having a size of 120 mm×75 mm×3.9 mm, the assembly is maintained in a vacuum at 140° C. for 3 minutes in a vacuum laminator and is subjected to pressing for 30 minutes at 0.1 MPa (gauge pressure), and the film is adhered to the air-side of the glass plate; next, the film is separated from the glass plate at a tensile rate of 100 mm/min, and the maximum stress is calculated as the adhesive strength (N/15 mm) to a glass plate.

7. The resin composition according to claim 1,
wherein the ionomer (A) of the ethylene-unsaturated carboxylic acid-based copolymer includes a polyvalent metal ion ionomer (A1) of an ethylene-unsaturated carboxylic acid-based copolymer; and a polyvalent metal ion ionomer (A2) of an ethylene-unsaturated carboxylic acid-based copolymer different from the polyvalent metal ion ionomer (A1) of the ethylene-unsaturated carboxylic acid-based copolymer.

8. A laminated glass interlayer film comprising a layer formed from the resin composition according to claim 1.

9. The laminated glass interlayer film according to claim 8,
having a multilayer configuration including at least one layer formed from the resin composition.

10. The laminated glass interlayer film according to claim 9,
having a three-layer configuration including an intermediate layer; and two outer layers formed on both surfaces of the intermediate layer so as to have the intermediate layer interposed therebetween.

11. A laminated glass comprising:
the laminated glass interlayer film according to claim 8; and
transparent plate-like members provided on both surfaces of the laminated glass interlayer film.

12. The laminated glass according to claim 11, wherein a length of a clouded portion as measured by the following method is 5 mm or less:
(method)
the laminated glass is immersed in warm water at 90° C. for 2 hours; and next, in a clouded portion produced at an edge of the laminated glass, the length of the clouded portion in a direction perpendicular to an end-face of the laminated glass is measured.

13. A solar cell encapsulant comprising a layer formed from the resin composition according to claim 1.

14. The solar cell encapsulant according to claim 13,
having a multilayer configuration including at least one layer formed from the resin composition.

15. The solar cell encapsulant according to claim 14,
having a three-layer configuration including an intermediate layer; and two outer layers formed on both surfaces of the intermediate layer so as to have the intermediate layer interposed therebetween.

16. A solar cell module comprising the solar cell encapsulant according to claim 13 in a configuration thereof.

* * * * *